(12) United States Patent
An et al.

(10) Patent No.: US 10,983,442 B2
(45) Date of Patent: Apr. 20, 2021

(54) PROJECTION OBJECTIVE

(71) Applicant: SHANGHAI MICRO ELECTRONICS EQUIPMENT (GROUP) CO., LTD., Shanghai (CN)

(72) Inventors: Fuping An, Shanghai (CN); Zhaoxiang Chu, Shanghai (CN); Yinzhang Guo, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/651,663

(22) PCT Filed: Sep. 29, 2018

(86) PCT No.: PCT/CN2018/108745
§ 371 (c)(1),
(2) Date: Mar. 27, 2020

(87) PCT Pub. No.: WO2019/062941
PCT Pub. Date: Apr. 4, 2019

(65) Prior Publication Data
US 2020/0310256 A1 Oct. 1, 2020

(30) Foreign Application Priority Data

Sep. 29, 2017 (CN) .......................... 201710909308.1

(51) Int. Cl.
*G03F 7/20* (2006.01)
(52) U.S. Cl.
CPC ............................... *G03F 7/70241* (2013.01)
(58) Field of Classification Search
CPC .................................................. G03F 7/70241
See application file for complete search history.

(56) References Cited

U.S. PATENT DOCUMENTS 5,995,296 A * 11/1999 Usui ...................... G02B 15/17
359/684
6,008,884 A * 12/1999 Yamaguchi ......... G03F 7/70241
355/53

(Continued)

FOREIGN PATENT DOCUMENTS

CN         1639644 A      7/2005
CN       102486569 A      6/2012

(Continued)

*Primary Examiner* — Steven Whitesell Gordon
(74) *Attorney, Agent, or Firm* — Muncy, Geissler, Olds & Lowe, P.C.

(57) ABSTRACT

A projection objective, used for projecting an object space to an image space. The objective includes, from the object space along an optical axis in sequence: a first lens set (G1) having positive focal power, a second lens set (G2) having negative focal power, a third lens set (G3) having positive focal power, a fourth lens set (G4) having negative focal power, and a fifth lens set (G5) having positive focal power. Aspheric lenses are provided in the first lens set (G1), the second lens set (G2), the third lens set (G3), the fourth lens set (G4), and the fifth lens set (G5). According to the design, the number of lenses is reduced, the structure of the objective is more compact, the transmittance of the objective is improved, the structural design of aspheric lenses is optimized, the asphericity of the aspheric lenses is reduced, the processing difficulty and costs for the aspheric lenses are reduced, and except for the above situations, the objective has a bitelecentric structure, and the sensitivity of the objective for micro irregularity defects on a mask surface is reduced.

19 Claims, 6 Drawing Sheets

(56) References Cited

U.S. PATENT DOCUMENTS

| | | | |
|---|---|---|---|
| 6,084,723 A | 7/2000 | Matsuzawa et al. | |
| 6,867,922 B1* | 3/2005 | Terasawa | G02B 13/143 |
| | | | 359/649 |
| 2002/0149855 A1* | 10/2002 | Schuster | G03F 7/70241 |
| | | | 359/649 |
| 2003/0174408 A1* | 9/2003 | Rostalski | G03F 7/70241 |
| | | | 359/642 |
| 2004/0017554 A1 | 1/2004 | Schuster et al. | |
| 2005/0030634 A1* | 2/2005 | Schuster | G03F 7/70883 |
| | | | 359/649 |
| 2005/0111108 A1* | 5/2005 | Schuster | G03F 7/70241 |
| | | | 359/649 |
| 2006/0056064 A1* | 3/2006 | Shafer | G03F 7/70275 |
| | | | 359/727 |
| 2009/0080086 A1* | 3/2009 | Shafer | G03F 7/70241 |
| | | | 359/651 |
| 2013/0250434 A1* | 9/2013 | Zhu | G02B 13/18 |
| | | | 359/649 |

FOREIGN PATENT DOCUMENTS

| | | | |
|---|---|---|---|
| CN | 103364928 A | 10/2013 | |
| CN | 105527701 A | 4/2016 | |
| CN | 205982805 U | 2/2017 | |
| CN | 104035187 B | 4/2017 | |
| EP | 0 732 605 A2 | 9/1996 | |
| JP | H11-097347 A | 4/1999 | |
| TW | 201219885 A | 5/2012 | |
| TW | 201732443 A | 9/2017 | |

\* cited by examiner

PROJECTION OBJECTIVE

TECHNICAL FIELD

The present application relates to the field of optical technology and, in particular, to a projection objective.

BACKGROUND

Projection photolithography is an optical exposure process that transfers an IC pattern on a mask to a photoresist-coated wafer in a step-and-repeat or step-and-scan manner using the principle of projection imaging. Generally, the resolution of a photolithography process can be achieved by using a shorter wavelength or an increased numerical aperture, or by reducing process factors or otherwise. The continuously increasing integration of integrated circuit devices places a higher requirement on the resolution of objectives. In addition, confined to the space limitation of the whole machine size, lithography technology has become more and more strict to the volume requirements of projection objectives under the condition that exposure performance of the projection objective is ensured not to be affected. Therefore, miniaturization, compact structure, excellent performance, and reasonable cost of lithographic projection objectives have increasingly become a trend and need for technological development.

In prior art, on one hand, the objective system of projection photolithography incorporates a great number of lenses, which would result in an energy absorption in the system and hence decrease the overall transmittance of the objective. On the other hand, the objective system has a large object side telecentricity, making it very sensitive to the roughness of the mask surface caused by manufacturing, especially the very high sensitivity to distortion, so that even a tiny convex or concave defect on the mask surface would be magnified by the objective and thus affect the exposure quality on the wafer surface.

SUMMARY

It is an object of the present application to provide a projection objective to solve the problem of a large number of lenses and a large object side telecentricity in the existed objective group, which allows reducing the number of lenses and the sensitivity of the objective system to mask defects.

To this end, the present application provides a projection objective for projecting an image from an object side to an image side. The projection objective comprises, sequentially disposed from the object side along an optical axis:

a first lens group with a positive focal power, comprising a first lens sub-group with a negative focal power, wherein one lens of the first lens sub-group has an aspheric surface at a side close to the object side;

a second lens group with a negative focal power, comprising a first biconcave lens sub-group, a lens of the first biconcave lens sub-group closest to the image side having an aspheric surface at a side close to the object side;

a third lens group with a positive focal power;

a fourth lens group with a negative focal power, comprising a second biconcave lens sub-group, wherein a lens of the second biconcave lens sub-group closest to the object side has an aspheric surface at a side close to the image side; and a fifth lens group with a positive focal power, comprising a third biconcave lens sub-group, a lens of the third biconcave lens sub-group closest to the image side having an aspheric surface at a side close to the image side.

Optionally, the first lens group further comprises a second lens sub-group with a positive focal power. The first lens sub-group at least comprises one lens with a negative focal power and the second lens sub-group at least comprises two lenses, each having a positive focal power.

Optionally, the second lens group at least comprises four lenses, each having a negative focal power, and the first biconcave lens sub-group has a negative focal power and at least comprises two biconcave lenses.

Optionally, the second lens group comprises N lenses, N being an even number greater than or equal to 4, and the first biconcave lens sub-group comprises M lenses, M being an even number greater than or equal to 2.

Optionally, lenses of the first biconcave lens sub-group are distributed at both sides a midpoint of an optical path defined by the optical axis passing through the second lens group. Lenses of the first biconcave lens sub-group are symmetrically arranged with respect to the midpoint of the optical path.

Optionally, the third lens group at least comprises two lenses, each having a positive power.

Optionally, each lens of the third lens group is made of a material having a refractive index of less than 1.6 at a working wavelength.

Optionally, the fourth lens group at least comprises three lenses each having a negative focal power.

Optionally, the fourth lens group at least comprises one meniscus lens with a negative focal power.

Optionally, the fifth lens group comprises a third lens sub-group, a fourth lens sub-group and a fifth lens sub-group, the third lens sub-group at least comprising two lenses, the fourth lens sub-group at least comprising three lenses, the fifth lens sub-group at least comprising five lenses.

Optionally, the fourth lens sub-group comprises the third biconcave lens sub-group. A lens of the third biconcave lens sub-group has an aspheric surface at a side close to the image side, and the third biconcave lens sub-group at least comprises one biconcave lens.

Optionally, the fifth lens sub-group at least comprises four meniscus lenses.

Optionally, an optical stop of the projection objective is located between the third lens sub-group and the fourth lens sub-group.

Optionally, each of the third lens sub-group and the fourth lens sub-groups is a lens sub-group having a positive focal power.

Optionally, each lens of the third lens group is made of silica having a refractive index of 1.47 at a working wavelength.

Optionally, the projection objective comprises an object side parallel plate and an image side parallel plate. The object side parallel plate is disposed on the optical axis at a side close to the object side, and the image side parallel plate is disposed on the optical axis at a side close to the image side.

Optionally, the projection objective has an object side working distance of greater than 32 mm and an image side working distance of greater than 8 mm.

Optionally, a maximum asphericity of each of the aspheric surfaces is less than 300 µm.

Optionally, the projection objective has an object side telecentricity of less than 6 mrad and an image side telecentricity of less than 3 mrad.

Optionally, the projection objective has a field curvature of less than 60 nm, a astigmatism of less than 50 nm, a distortion of less than 4 nm.

Optionally, a magnification of the projection objective is −0.25, an image side numerical aperture of 0.65 and an image-side field-of-view size of greater than 26 mm×16 mm.

The present application also provides an exposure apparatus comprising: a mask stage for supporting a mask; a workpiece stage for supporting a workpiece to be exposed; and a light source for emitting an exposure light beam. The exposure light beam projects a pattern on the mask to the workpiece after passing through the mask stage and the projection objective.

An expression of an aspheric surface in the projection objective is as follows:

$$Z = \frac{(CURV)Y^2}{1+(1-(1+K)(CURV)^2Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

where Z is an expression of a curve of the aspheric surface; Y is a semi-diameter dimension; CURV is a curvature; A is a fourth-order constant coefficient; B is a six-order constant coefficient; C is an eighth-order constant coefficient; D is a tenth-order constant coefficient; E is a twelfth-order constant coefficient; F is a fourteenth-order constant coefficient; G is a sixteenth-order constant coefficient; H is an eighteenth-order constant coefficient; J is a twentieth-order constant coefficient; and K is a taper coefficient.

Compared with the prior art, the projection objective of the present application offers the following advantageous effect:

1. It enables to reduce the number of lenses in the objective to result in a more compact optical structure and a reduced cost.
2. It enables to improve the transmittance of the objective system.
3. It has a bi-telecentric structure, enabling to decrease sensitivity of the objective to minimal convex or concave defects on a mask surface.
4. It enables to optimize the design of the aspheric lens surfaces to reduce the asphericity, which in turn lowers the difficulty and cost of aspheric manufacturing.

In the figures, O—object side; 1—first lens; 2—second lens; 3—third lens; 4—fourth lens; 5—fifth lens; 6—sixth lens; 7—seventh lens; 8—eighth lens; 9—ninth lens; 10—tenth lens; 11—eleventh lens; 12—twelfth lens; 13—thirteenth lens; 14—fourteenth lens; 15—fifteenth lens; 16—sixteenth lens; 17—seventeenth lens; 18—eighteenth lens; 19—nineteenth lens; 20—twentieth lens; 21—twenty-one lens; 22, a twenty-two lens; 23—twenty-third lens; 24—twenty-fourth lens; 25—twenty-fifth lens; I-image side; ST—optical stop; G1—first lens group; G2—second lens group; G3—third lens group; G4—fourth lens group; G5—fifth lens group; SG1—first lens sub-group; SG2—second lens sub-group; SG3—third lens sub-group; SG4—fourth lens sub-group; SG5—fifth lens sub-group; S—sagittal field curvature profile; T—meridional field curvature profile; F—object side telecentric profile; N—image side telecentric profile.

DETAILED DESCRIPTION

Specific embodiments of the present application will be described in greater detail below with reference to schematic diagrams. Features and advantages of present application will become more apparent from the following description and the appended claims. It should be noted that the accompanying drawings are presented in a very simplified form and not necessarily presented to scale, with the only intention to facilitate convenience and clarity in explaining the present application.

Embodiment 1

Figure 1:
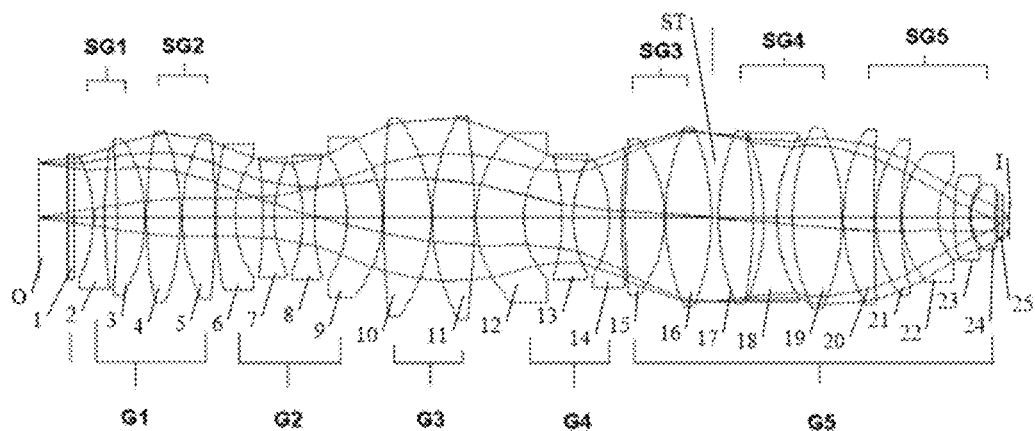
FIG. 1 is a structural diagram of a projection objective according to embodiment 1 of the present application.

Reference is now made to FIG. 1, a structural diagram of a projection objective according to embodiment 1 of the present application. The projection objective in this embodiment has a total length not exceeding 1100 mm, and is suitable for I-line ultraviolet spectrum with a maximum wavelength band up to 5 nm. The projection objective in this embodiment has a magnification of −0.25, an image side numerical aperture of 0.65 and an image-side FoV (Field of View) size of 26 mm×16 mm.

The projection objective according to embodiment 1 includes 25 optical elements. The first optical element and the twenty-fifth optical element are parallel plates with no focal power, which are used to protect internal components of the objective. Except for the two parallel plates, four elements of the remaining 23 optical elements each have a surface being an aspheric surface with a relatively small asphericity. In embodiment 1, the projection objective is sequentially provided with, from the beam incident direction, an object side parallel plate 1, a first lens group G1, a second lens group G2, a third lens group G3, a fourth lens group G4, a fifth lens group G5 and an image-side parallel plate 25.

The first lens group G1 has a positive focal power and is consisted of the following four lenses: the second lens 2, which is a biconcave lens with a negative focal power, one surface of the second lens 2 close to the object side being an aspheric surface; a third lens 3, which is a meniscus lens with a positive focal power; a fourth lens 4, which is biconvex lens with a positive focal power; and a fifth lens 5, which is a biconvex lens with a positive focal power. The meniscus lens has a small curvature radius, providing an effect of chromatic aberration elimination. The biconcave lens has a negative focal length and is configured to diverge light. The biconvex lens has a positive focal power and is configured to converge light.

The second lens group G2 has a negative focal power and is consisted of the following four lenses: a sixth lens 6, which is a meniscus lens with a negative focal power; a seventh lens 7, which is a biconcave lens with a negative focal power; a eighth lens 8, which is a biconcave lens with a negative focal power, one surface of the eighth lens 8 close to the object side being an aspheric surface; and a ninth lens 9, which is a meniscus lens with a negative focal power. The meniscus lens is designed with a small curvature radius, providing an effect of chromatic aberration elimination. The biconcave lens has a negative focal power and is configured to diverge light. The biconvex lens has a positive focal power and is configured to converge light.

The third lens group G3 has a positive focal power and is consisted of the following two lenses: a tenth lens 10, which is a biconvex lens with a positive focal power; and an eleventh lens 11, which is a biconvex lens with a positive focal power. The biconvex lens has a positive focal power and is configured to converge light.

The third lens group G3 is made of a material with a refractive index less than 1.6 at the working wavelength. In particular, the third lens group G3 is made of silica with a refractive index less than 1.47 at the working wavelength.

The fourth lens group G4 has a negative focal power and is consisted of the following three lenses: a twelfth lens 12, which is a meniscus lens with a negative focal power; a thirteenth lens 13, which is a biconcave lens with a negative focal power, one surface of the thirteenth lens 13 close to the image side being an aspheric surface; and a fourteenth lens 14, which is a biconcave lens with a negative focal power. The meniscus lens has a small surface radius of curvature, and an effect of chromatic aberration elimination. The biconcave lens has a negative focal length and is configured to diverge light.

The fifth lens group G5 has a positive focal power and is consisted of the following ten lenses: a fifteenth lens 15, which is a biconvex lens with a positive focal power; a sixteenth lens 16, which is biconvex lens with a positive focal power; a seventeenth lens 17, which is a biconvex lens with a positive focal power; a eighteenth lens 18, which is a biconcave lens with a negative focal power, one surface of the eighteenth lens 18 close to the image side being an aspheric surface; a nineteenth lens 19, which is a biconvex lens with a positive focal power; and twentieth to twenty-fourth lenses 20-24, each of the twentieth to twenty-fourth lenses 20-24 being a meniscus lens. The meniscus lens has a small curvature radius, providing an effect of chromatic aberration elimination. The biconcave lens has a negative focal length and is configured to diverge light. The biconvex lens has a positive focal power and is configured to converge light.

The first lens group G1 may be divided into a first lens sub-group SG1 with a negative focal power and a lens sub-group SG2 with a positive focal power.

The fifth lens group G5 may be divided into a third lens sub-group SG3, a fourth lens sub-group SG4 and a fifth lens sub-group SG5. The optical stop of the projection objective is situated between the third lens sub-group SG3 and the fourth lens sub-group SG4, and each of the lens groups immediately upstream and downstream of the optical stop has a positive focal power.

One surface of the second lens 2 close to the object side, one surface of the eighth lens 8 close to the object side, one surface of the thirteenth lens 13 close to the image side and one surface of eighteenth lens 18 close to the image side are aspheric surfaces. The surface of the thirteenth lens 13 close to the image side has the greatest asphericity with a value of 255 μm.

Since the projection objective is a bi-telecentric structure, the chief ray of each field of view at the object side is almost parallelly entered into the front surface of the first parallel plate and the chief ray of each field of view at the image side is almost parallelly ejected to converge on the image surface. The chief ray of each field of view at the object side has an angle of 6 mrad with respect to the optical axis, and the chief ray of each field of view at the image side has an angle of 3 mrad with respect to the optical axis. The projection objective has an object side working distance of greater than 32 mm and an image side working distance of greater than 8 mm.

Table 1 summarizes specific parameters of the projection objective according to embodiment 1. The radius value R (i.e., the radius of curvature along the direction of the optical axis) is positive indicates that the center of curvature is on the side close to the object side and the radius value R is negative indicates that the center of curvature is on the side close to the image side. The values of radius R, thickness d and semi-diameter Y (i.e., half the size of the lens along the direction perpendicular to the optical axis) are all given in millimeters (mm) The serial number "O" represents the object side; "I" represents the image side; "ST" represents the optical stop, "a" represents the lens surface close to the object side; and "b" represents the lens surface close to the image side. For example, "22a" denotes the surface of the lens 22 close to the object side).

TABLE 1

Parameters of Projection Objective in Embodiment 1

| | Type | Radius R | Thickness d | Material | Semi-diameter Y |
|---|---|---|---|---|---|
| O | Spherical | 1.00E+18 | 32 | Air | 66.51 |
| 1a | Spherical | 1.00E+18 | 8 | Silica | 67.43 |
| 1b | Spherical | 1.00E+18 | 19.27463 | $N_2$ | 68.15 |
| 2a | Aspheric | −164.482 | 12 | SFSL5Y | 77.24 |
| 2b | Spherical | 414.9309 | 16.88204 | $N_2$ | 81.48 |
| 3a | Spherical | −1499.43 | 32.066 | NIGS5742 | 85.75 |
| 3b | Spherical | −177.856 | 1.5 | $N_2$ | 93.64 |
| 4a | Spherical | 449.3769 | 36.89291 | NIGS5859 | 94.31 |
| 4b | Spherical | −295.685 | 2 | $N_2$ | 89.67 |
| 5a | Spherical | 189.0181 | 38.71479 | NIGS5859 | 86.30 |
| 5b | Spherical | −1037.32 | 1.5 | $N_2$ | 80.41 |
| 6a | Spherical | 565.5162 | 19.30977 | SFSL5Y | 66.78 |
| 6b | Spherical | 116.809 | 30.47313 | $N_2$ | 65.41 |
| 7a | Spherical | −510.594 | 13 | SFSL5Y | 61.64 |
| 7b | Spherical | 147.7951 | 32.55369 | $N_2$ | 61.90 |
| 8a | Aspheric | −152.56 | 13 | PBL6Y | 68.15 |
| 8b | Spherical | 271.9053 | 36.27214 | $N_2$ | 71.31 |
| 9a | Spherical | −130.682 | 30.04307 | SFSL5Y | 84.12 |
| 9b | Spherical | −141.865 | 1.5 | $N_2$ | 98.89 |
| 10a | Spherical | 1500 | 50.61223 | SFSL5Y | 102.71 |
| 10b | Spherical | −177.805 | 1.5 | $N_2$ | 106.21 |
| 11a | Spherical | 209.2657 | 45.54487 | NIGS5859 | 103.82 |
| 11b | Spherical | −1500 | 2.30159 | $N_2$ | 90.52 |
| 12a | Spherical | 146.966 | 56 | SFSL5Y | 67.35 |
| 12b | Spherical | 111.023 | 37.86029 | $N_2$ | 64.95 |
| 13a | Spherical | −251.668 | 13 | NIGS5742 | 61.27 |
| 13b | Aspheric | 152.5259 | 38.68932 | $N_2$ | 62.42 |
| 14a | Spherical | −121.873 | 24.16022 | NIGS5742 | 76.87 |
| 14b | Spherical | 620.1948 | 4.451942 | $N_2$ | 78.98 |
| 15a | Spherical | 932.0581 | 42.10127 | SFSL5Y | 84.26 |
| 15b | Spherical | −157.429 | 1.5 | $N_2$ | 95.26 |
| 16a | Spherical | 268.1493 | 48.06939 | SFSL5Y | 95.85 |
| 16b | Spherical | −290.335 | 1.5 | $N_2$ | 96.21 |
| ST | Spherical | 1.00E+18 | 14.09318 | $N_2$ | 92.83 |

TABLE 1-continued

Parameters of Projection Objective in Embodiment 1

| | Type | Radius R | Thickness d | Material | Semi-diameter Y |
|---|---|---|---|---|---|
| 17a | Spherical | 298.8663 | 37.14771 | SFSL5Y | 91.72 |
| 17b | Spherical | −489.003 | 10.52757 | $N_2$ | 90.95 |
| 18a | Spherical | −269.604 | 15 | NIGS5742 | 91.17 |
| 18b | Aspheric | 210.7179 | 10.12045 | $N_2$ | 92.28 |
| 19a | Spherical | 305.3638 | 71.6614 | SFSL5Y | 96.61 |
| 19b | Spherical | −241.961 | 1.5 | $N_2$ | 94.38 |
| 20a | Spherical | 158.4077 | 39.44514 | SFSL5Y | 90.95 |
| 20b | Spherical | 852.1286 | 1.5 | $N_2$ | 84.00 |
| 21a | Spherical | 161.6164 | 39.88998 | NIGS5859 | 72.17 |
| 21b | Spherical | 252.3264 | 1.5 | $N_2$ | 66.99 |
| 22a | Spherical | 129.2183 | 39.89879 | NIGS5859 | 48.66 |
| 22b | Spherical | 109.157 | 11.44462 | $N_2$ | 45.63 |
| 23a | Spherical | 210.01 | 17.29906 | NIGS5859 | 35.68 |
| 23b | Spherical | 67.69884 | 1.5 | $N_2$ | 34.86 |
| 24a | Spherical | 60.38229 | 26.52491 | NIGS5742 | 27.27 |
| 24b | Spherical | 568.4124 | 3.673896 | $N_2$ | 24.65 |
| 25a | Spherical | 1.00E+18 | 5 | Silica | 22.18 |
| 25b | Spherical | 1.00E+18 | 8 | Air | 15.26 |
| I | Spherical | 1.00E+18 | 3.63E−05 | Air | 15.26 |

As can be seen from Table 1, each of 2a, 8a, 13b and 18b is an aspheric surface that can be expressed as:

$$Z = \frac{(CURV)Y^2}{1+(1-(1+K)(CURV)^2 Y^2)^{1/2}} + (A)Y^4 + (B)Y^6 +$$
$$(C)Y^8 + (D)Y^{10} + (E)Y^{12} + (F)Y^{14} + (G)Y^{16} + (H)Y^{18} + (J)Y^{20}$$

Table 2 provides parameters of the lens surfaces 2a, 8a, 13b and 18b, in which Z is an expression of a curve of the aspheric surface; Y is a semi-diameter dimension; CURV is a curvature; A is a fourth-order constant coefficient; B is a six-order constant coefficient; C is an eighth-order constant coefficient; D is a tenth-order constant coefficient; E is a twelfth-order constant coefficient; F is a fourteenth-order constant coefficient; G is a sixteenth-order constant coefficient; H is an eighteenth-order constant coefficient; J is a twentieth-order constant coefficient; and K is a taper coefficient.

TABLE 2

Parameters of Aspheric Surfaces in Embodiment 1

| Aspheric Surface | 2a | 8a | 13b | 18b |
|---|---|---|---|---|
| CURV | −6.08E−03 | −6.55E−03 | 6.56E−03 | 4.75E−03 |
| K | 0 | 0 | 1.28853361 | 0 |
| A | −1.85E−08 | 1.10E−08 | 3.72E−08 | 1.06E−08 |
| B | 9.55E−13 | −7.01E−13 | −2.31E−12 | −3.44E−14 |
| C | 1.19E−17 | 9.12E−17 | −2.15E−16 | −5.01E−18 |
| D | 2.55E−20 | −2.67E−20 | −3.44E−20 | −2.49E−22 |
| E | −3.06E−24 | 8.08E−24 | 1.87E−24 | 8.98E−27 |
| F | 2.79E−28 | −1.00E−27 | −4.86E−28 | −1.25E−31 |
| G | 0 | 0 | 0 | 0 |
| H | 0 | 0 | 0 | 0 |
| J | 0 | 0 | 0 | 0 |

Figure 2:
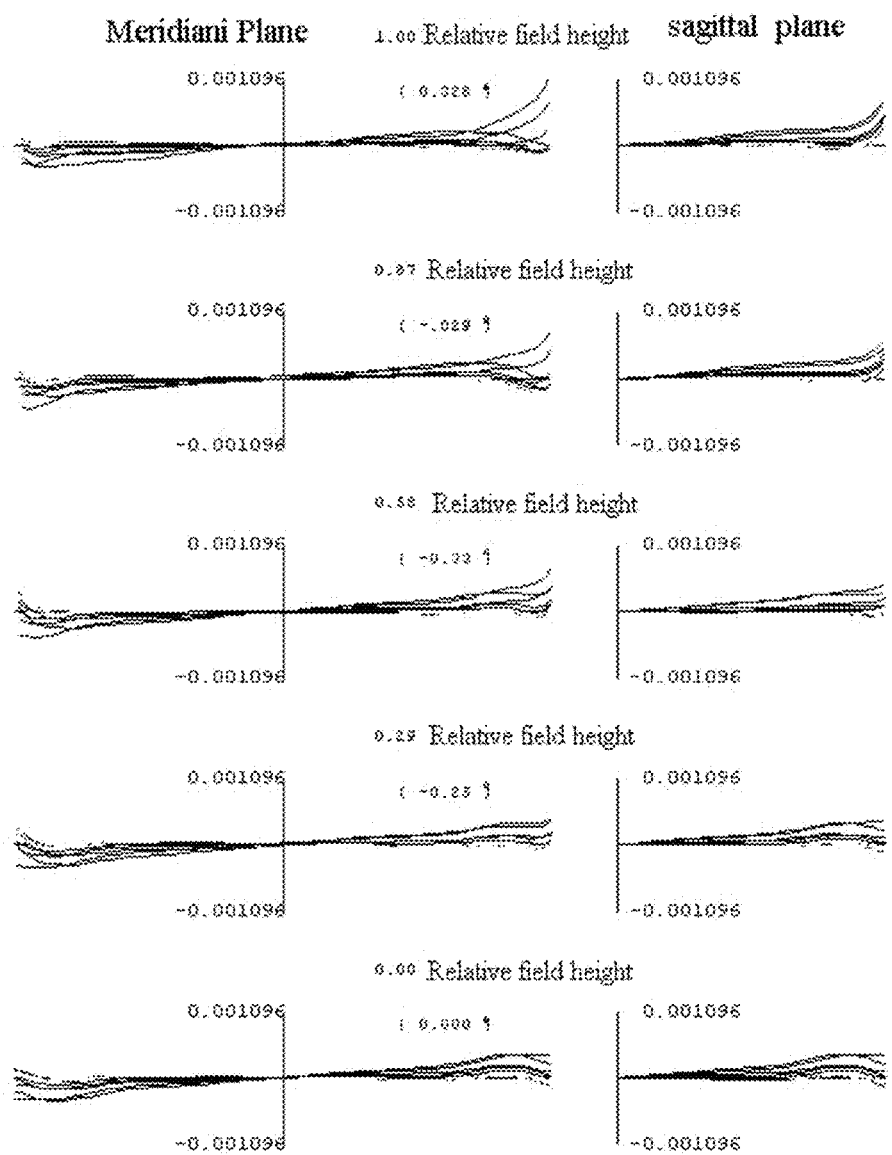
FIG. 2 is a diagram showing a wave-front aberration profile of a projection objective according to embodiment 1 of present application.

Please refer to FIG. 2, which is a diagram showing a wave-front aberration profile of the projection objective according to embodiment 1 of present application. From the profile, it can be seen that the wavefront of the objective's full field-of-view has been corrected and chromatic aberration has been well corrected.

Figure 3:
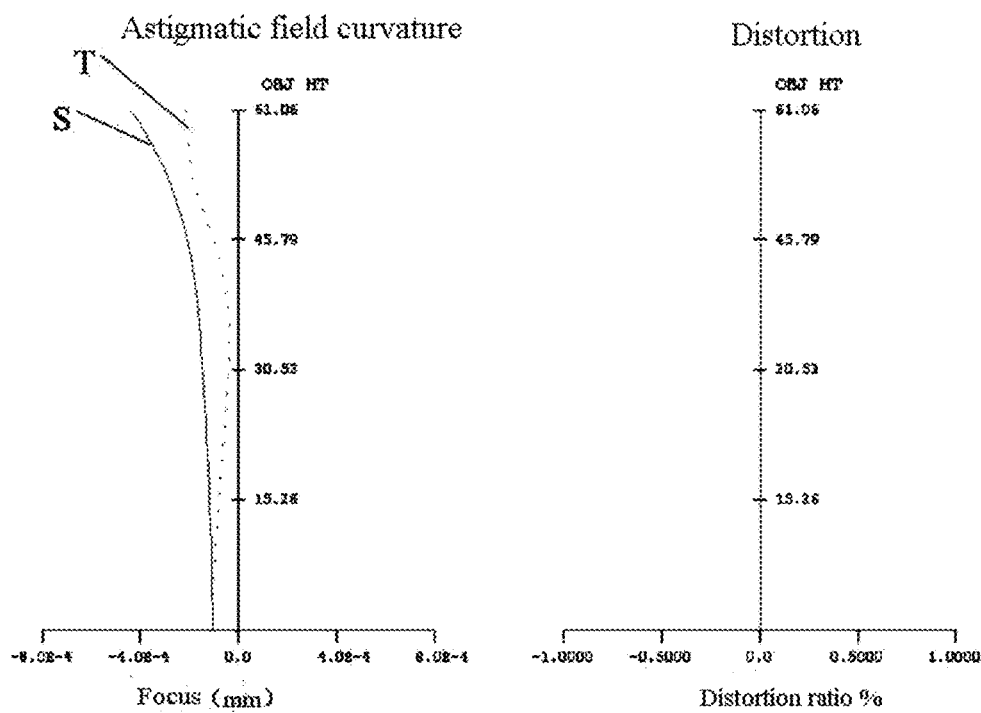
FIG. 3 is a diagram showing a field curvature and a distortion of a projection objective according to embodiment 1 of present application.

Please refer to FIG. 3, which is a diagram showing a field curvature, a astigmatism and a distortion of the projection objective according to embodiment 1 of present application. As can be seen from the figure, each of the meridional field curvature profile T and sagittal field curvature profile S is less than 40 nm, the astigmatism being less than 20 nm, the distortion being about 3 nm.

Figure 4:
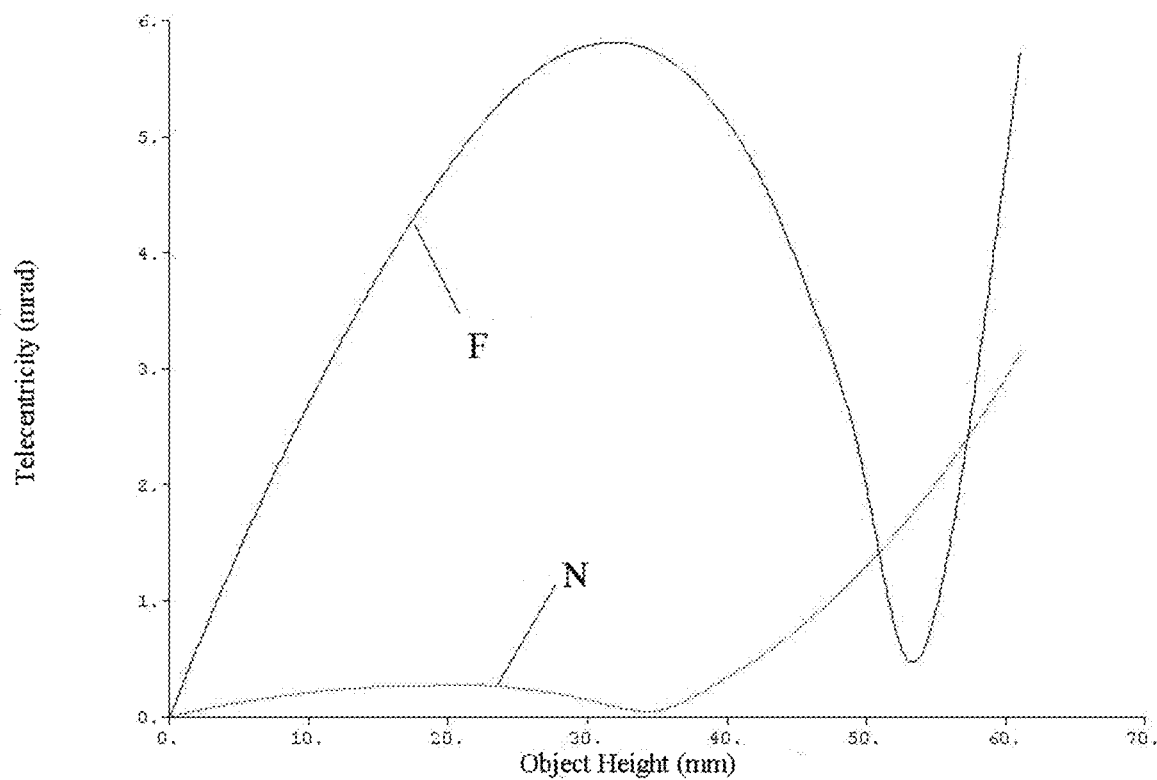
FIG. 4 shows a telecentric profile of a projection objective according to embodiment 1 of present application.

Please refer to FIG. 4, which shows a telecentric profile of the projection objective according to embodiment 1 of present application. As can be seen from the figure, projection objective has a maximum value of telecentricity of less than 6 mrad at the object side, and a maximum value of telecentricity of less than 3 mrad at the image side.

Figure 5:
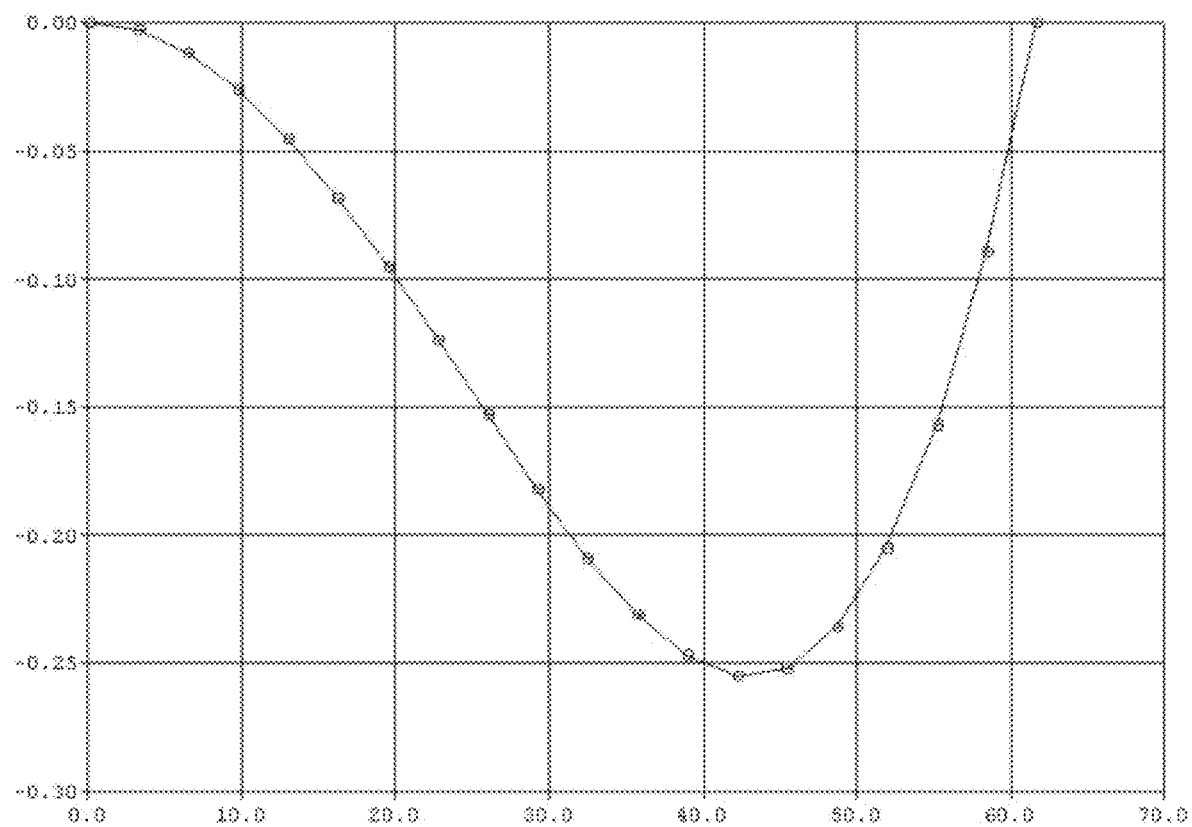
FIG. 5 shows an aspheric profile of a projection objective according to embodiment 1 of present application.

Please refer to FIG. 5, which shows the aspheric profile of the largest aspheric surface in the projection objective according to embodiment 1 of present application. As can be seen from the figure, the aspheric surface has a maximum value of asphericity at a semi-diameter of 42 mm, and the maximum value is 255 μm.

Embodiment 2

Figure 6:
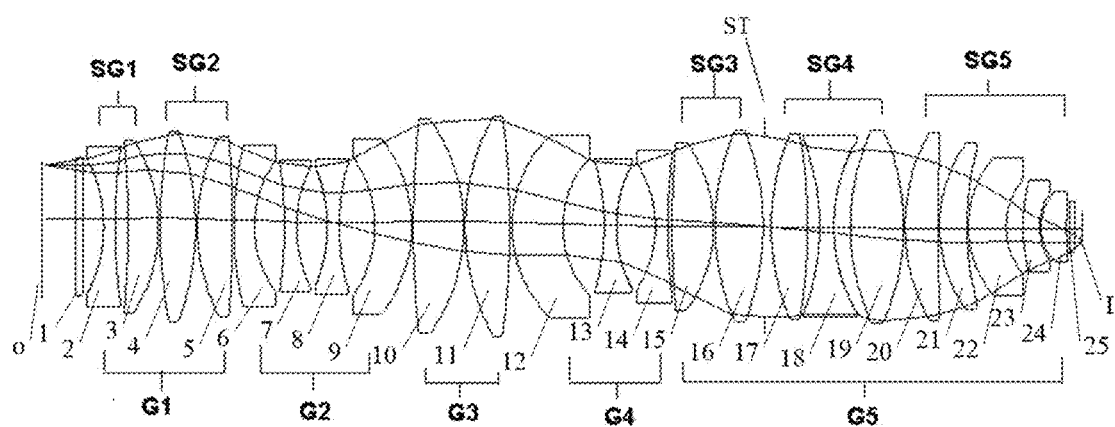
FIG. 6 is a structural diagram of a projection objective according to embodiment 2 of the present application.

Reference is now made to FIG. 6, a structural diagram of a projection objective according to embodiment 2 of the present application. The projection objective in this embodiment has a total length not exceeding 1100 mm, and is suitable for I-line ultraviolet spectrum with a maximum wavelength band up to 5 nm. The projection objective in this embodiment has a magnification of −0.25, an image side numerical aperture of 0.65 and an image-side FoV size of 26 mm×19.2 mm.

The projection objective according to embodiment 2 includes 25 optical elements. The first optical element and the twenty-fifth optical element are parallel plates with no focal power, which are used to protect internal components of the objective. Except for the two parallel plates, four elements of the remaining 23 optical elements each have a surface being an aspheric surface with a relatively small asphericity. In embodiment 2, the projection objective is sequentially provided with, from the beam incident direction, an object side parallel plate 1, a first lens group G1, a second lens group G2, a third lens group G3, a fourth lens group G4, a fifth lens group G5 and an image-side parallel plate 25.

The first lens group G1 has a positive focal power and is consisted of the following four lenses: the second lens 2, which is a biconcave lens with a negative focal power, one surface of the second lens 2 close to the object side being an aspheric surface; a third lens 3, which is a meniscus lens with a positive focal power; a fourth lens 4, which is biconvex lens with a positive focal power; and a fifth lens 5, which is a biconvex lens with a positive focal power. The meniscus lens has a small curvature radius, providing an effect of chromatic aberration elimination. The biconcave lens has a negative focal length and is configured to diverge light. The biconvex lens has a positive focal power and is configured to converge light.

lens group G2 has a negative focal power and is consisted of the following four lenses: a sixth lens 6, which is a meniscus lens with a negative focal power; a seventh lens 7, which is a biconcave lens with a negative focal power; a eighth lens 8, which is a biconcave lens with a negative focal power, one surface of the eighth lens 8 close to the object side being an aspheric surface; and a ninth lens 9, which is a meniscus lens with a negative focal power. The meniscus lens is designed with a small curvature radius, providing an effect of chromatic aberration elimination. The biconcave lens has a negative focal power and is configured to diverge light.

The third lens group G3 has a positive focal power and is consisted of the following two lenses: a tenth lens 10, which is a biconvex lens with a positive focal power; and an eleventh lens 11, which is a biconvex lens with a positive focal power. The biconvex lens has a positive focal power and is configured to converge light.

The third lens group G3 is made of a material with a refractive index less than 1.6 at the working wavelength. In particular, the third lens group G3 is made of silica with a refractive index less than 1.47 at the working wavelength.

The fourth lens group G4 has a negative focal power and is consisted of the following three lenses: a twelfth lens 12, which is a meniscus lens with a negative focal power; a thirteenth lens 13, which is a biconcave lens with a negative focal power, one surface of the thirteenth lens 13 close to the image side being an aspheric surface; and a fourteenth lens 14, which is a biconcave lens with a negative focal power. The meniscus lens has a small surface radius of curvature, and an effect of chromatic aberration elimination. The biconcave lens has a negative focal length and is configured to diverge light.

The fifth lens group G5 has a positive focal power and is consisted of the following ten lenses: a fifteenth lens 15, which is a biconvex lens with a positive focal power; a sixteenth lens 16, which is biconvex lens with a positive focal power; a seventeenth lens 17, which is a biconvex lens with a positive focal power; a eighteenth lens 18, which is a biconcave lens with a negative focal power, one surface of the eighteenth lens 18 close to the image side being an aspheric surface; a nineteenth lens 19, which is a biconvex lens with a positive focal power; and twentieth to twenty-fourth lenses 20-24, each of the twentieth to twenty-fourth lenses 20-24 being a meniscus lens. The meniscus lens has a small curvature radius, providing an effect of chromatic aberration elimination. The biconcave lens has a negative focal length and is configured to diverge light. The biconvex lens has a positive focal power and is configured to converge light.

The first lens group G1 may be divided into a first lens sub-group SG1 with negative focal power and a lens sub-group SG2 with a positive focal power.

The fifth lens group G5 may be divided into a third lens sub-group SG3, a fourth lens sub-group SG4 and a fifth lens sub-group SG5. The optical stop of the projection objective is situated between the third lens sub-group SG3 and the fourth lens sub-group SG4, and each of the lens groups immediately upstream and downstream of the optical stop has a positive focal power.

One surface of the second lens 2 close to the object side, one surface of the eighth lens 8 close to the object side, one surface of the thirteenth lens 13 close to the image side and one surface of eighteenth lens 18 close to the image side are aspheric surfaces. The surface of the thirteenth lens 13 close to the image side has the greatest asphericity with an aspheric value of 291 μm.

Since the projection objective is a bi-telecentric structure, the chief ray of each field of view at the object side is almost parallelly entered into the front surface of the first parallel plate and the chief ray of each field of view at the image side is almost parallelly ejected to converge on the image surface. The chief ray of each field of view at the object side has an angle of 6 mrad with respect to the optical axis, and the chief ray of each field of view at the image side has an angle of 3 mrad with respect to the optical axis. The projection objective has an object side working distance of greater than 32 mm and an image side working distance of greater than 8 mm.

Table 3 summarizes specific parameters of the projection objective according to embodiment 1. The radius value R (i.e., the radius of curvature along the direction of the optical axis) is positive indicates that the center of curvature is on the side close to the object side and the radius value R is negative indicates that the center of curvature is on the side close to the image side. The values of radius R, thickness d and semi-diameter Y (i.e., half the size of the lens along the direction perpendicular to the optical axis) are all given in millimeters (mm) The serial number "0" represents the object side; "I" represents the image side; "ST" represents the optical stop, "a" represents the lens surface close to the object side; and "b" represents the lens surface close to the image side. For example, "22a" denotes the surface of the lens 22 close to the object side).

TABLE 3

Parameters of Projection Objective According in Embodiment 2

| No. | Type | Radius R | Thickness d | Material | Semi-diameter Y |
|---|---|---|---|---|---|
| O | Spherical | 1.00E+18 | 32 | Air | 70.15 |
| 1a | Spherical | 1.00E+18 | 8 | Silica | 71.09 |
| 1b | Spherical | 1.00E+18 | 22.63801 | N$_2$ | 71.78 |
| 2a | Aspheric | −164.482 | 12 | SFSL5Y | 82.65 |
| 2b | Spherical | 414.9309 | 10.59837 | N$_2$ | 84.14 |
| 3a | Spherical | −1499.43 | 33.56306 | NIGS5742 | 88.30 |
| 3b | Spherical | −177.856 | 1.5 | N$_2$ | 96.37 |
| 4a | Spherical | 449.3769 | 36.50192 | NIGS5859 | 97.10 |
| 4b | Spherical | −295.685 | 2 | N$_2$ | 93.22 |
| 5a | Spherical | 189.0181 | 37.3863 | NIGS5859 | 90.54 |
| 5b | Spherical | −1037.32 | 1.5 | N$_2$ | 83.63 |
| 6a | Spherical | 565.5162 | 21.66174 | SFSL5Y | 70.46 |
| 6b | Spherical | 116.809 | 28.14573 | N$_2$ | 69.10 |
| 7a | Spherical | −510.594 | 13 | SFSL5Y | 64.84 |
| 7b | Spherical | 147.7951 | 32.52844 | N$_2$ | 64.82 |
| 8a | Aspheric | −152.56 | 13 | PBL6Y | 70.44 |
| 8b | Spherical | 271.9053 | 38.20662 | N$_2$ | 73.13 |
| 9a | Spherical | −130.682 | 38.17875 | SFSL5Y | 90.30 |
| 9b | Spherical | −141.865 | 1.5 | N$_2$ | 106.82 |
| 10a | Spherical | 1500 | 54.06529 | SFSL5Y | 110.33 |
| 10b | Spherical | −177.805 | 1.5 | N$_2$ | 113.27 |
| 11a | Spherical | 209.2657 | 46.90557 | NIGS5859 | 111.23 |
| 11b | Spherical | −1500 | 1.5 | N$_2$ | 93.75 |
| 12a | Spherical | 146.966 | 53.89564 | SFSL5Y | 70.80 |
| 12b | Spherical | 111.023 | 43.52514 | N$_2$ | 68.01 |
| 13a | Spherical | −251.668 | 13 | NIGS5742 | 63.64 |
| 13b | Aspheric | 152.5259 | 40.47893 | N$_2$ | 64.75 |
| 14a | Spherical | −121.873 | 13.40266 | NIGS5742 | 76.64 |
| 14b | Spherical | 620.1948 | 8.406373 | N$_2$ | 82.66 |
| 15a | Spherical | 932.0581 | 46.26193 | SFSL5Y | 88.20 |
| 15b | Spherical | −157.429 | 1.5 | N$_2$ | 100.08 |
| 16a | Spherical | 268.1493 | 50.28803 | SFSL5Y | 100.12 |
| 16b | Spherical | −290.335 | 4.413708 | N$_2$ | 96.97 |
| ST | Spherical | 1.00E+18 | 12.7727 | N$_2$ | 97.60 |
| 17a | Spherical | 298.8663 | 40.66456 | SFSL5Y | 96.05 |
| 17b | Spherical | −489.003 | 11.02398 | N$_2$ | 95.16 |
| 18a | Spherical | −269.604 | 15 | NIGS5742 | 93.44 |
| 18b | Aspheric | 210.7179 | 20.47263 | N$_2$ | 96.85 |
| 19a | Spherical | 305.3638 | 44.17283 | SFSL5Y | 98.40 |
| 19b | Spherical | −241.961 | 1.5 | N$_2$ | 98.07 |
| 20a | Spherical | 158.4077 | 45.00829 | SFSL5Y | 94.96 |
| 20b | Spherical | 852.1286 | 1.5 | N$_2$ | 83.81 |
| 21a | Spherical | 161.6164 | 30.27027 | NIGS5859 | 76.73 |
| 21b | Spherical | 252.3264 | 1.5 | N$_2$ | 65.69 |
| 22a | Spherical | 129.2183 | 20.08467 | NIGS5859 | 53.09 |
| 22b | Spherical | 109.157 | 24.42187 | N$_2$ | 49.68 |
| 23a | Spherical | 210.01 | 21.96517 | NIGS5859 | 37.15 |
| 23b | Spherical | 67.69884 | 1.5 | N$_2$ | 36.16 |
| 24a | Spherical | 60.38229 | 27.82096 | NIGS5742 | 28.48 |
| 24b | Spherical | 568.4124 | 4.269855 | N$_2$ | 25.81 |
| 25a | Spherical | 1.00E+18 | 5 | Silica | 23.28 |
| 25b | Spherical | 1.00E+18 | 8 | Air | 16.16 |
| I | Spherical | 1.00E+18 | 3.63E−05 | Air | 16.16 |

As can be seen from Table 3, each of 2a, 8a, 13b and 18b is an aspheric surface and can be expressed as:

$$Z = \frac{(CURV)Y^2}{1+(1-(1+K)(CURV)^2Y^2)^{1/2}} + (A)Y^4 + (B)Y^6 +$$
$$(C)Y^8 + (D)Y^{10} + (E)Y^{12} + (F)Y^{14} + (G)Y^{16} + (H)Y^{18} + (J)Y^{20}$$

Table 4 provides parameters of the lens surfaces 2a, 8a, 13b and 18b, in which Z is an expression of a curve of the aspheric surface; Y is a semi-diameter dimension; CURV is a curvature; A is a fourth-order constant coefficient; B is a six-order constant coefficient; C is an eighth-order constant coefficient; D is a tenth-order constant coefficient; E is a twelfth-order constant coefficient; F is a fourteenth-order constant coefficient; G is a sixteenth-order constant coefficient; H is an eighteenth-order constant coefficient; J is a twentieth-order constant coefficient; and K is a taper coefficient.

TABLE 4

Parameters of Aspheric Surfaces in Embodiment 2

| Aspheric Surface | 2a | 8a | 13b | 18b |
|---|---|---|---|---|
| CURV | −6.53E−03 | −6.45E−03 | 6.79E−03 | 4.96E−03 |
| K | 0 | 0 | 1.28853361 | 0 |
| A | −2.78E−08 | 2.45E−08 | 3.79E−08 | 1.68E−08 |
| B | 4.37E−14 | −5.92E−13 | −3.05E−12 | −3.74E−14 |
| C | −4.73E−17 | 8.95E−17 | −3.73E−16 | −2.82E−18 |
| D | 1.29E−20 | −2.34E−20 | −4.98E−20 | 7.08E−23 |
| E | −1.85E−24 | 5.73E−24 | 9.70E−25 | −2.09E−27 |
| F | 1.35E−28 | −5.48E−28 | −5.52E−28 | 6.32E−31 |
| G | 0 | 0 | 0 | 0 |
| H | 0 | 0 | 0 | 0 |
| J | 0 | 0 | 0 | 0 |

Figure 7:
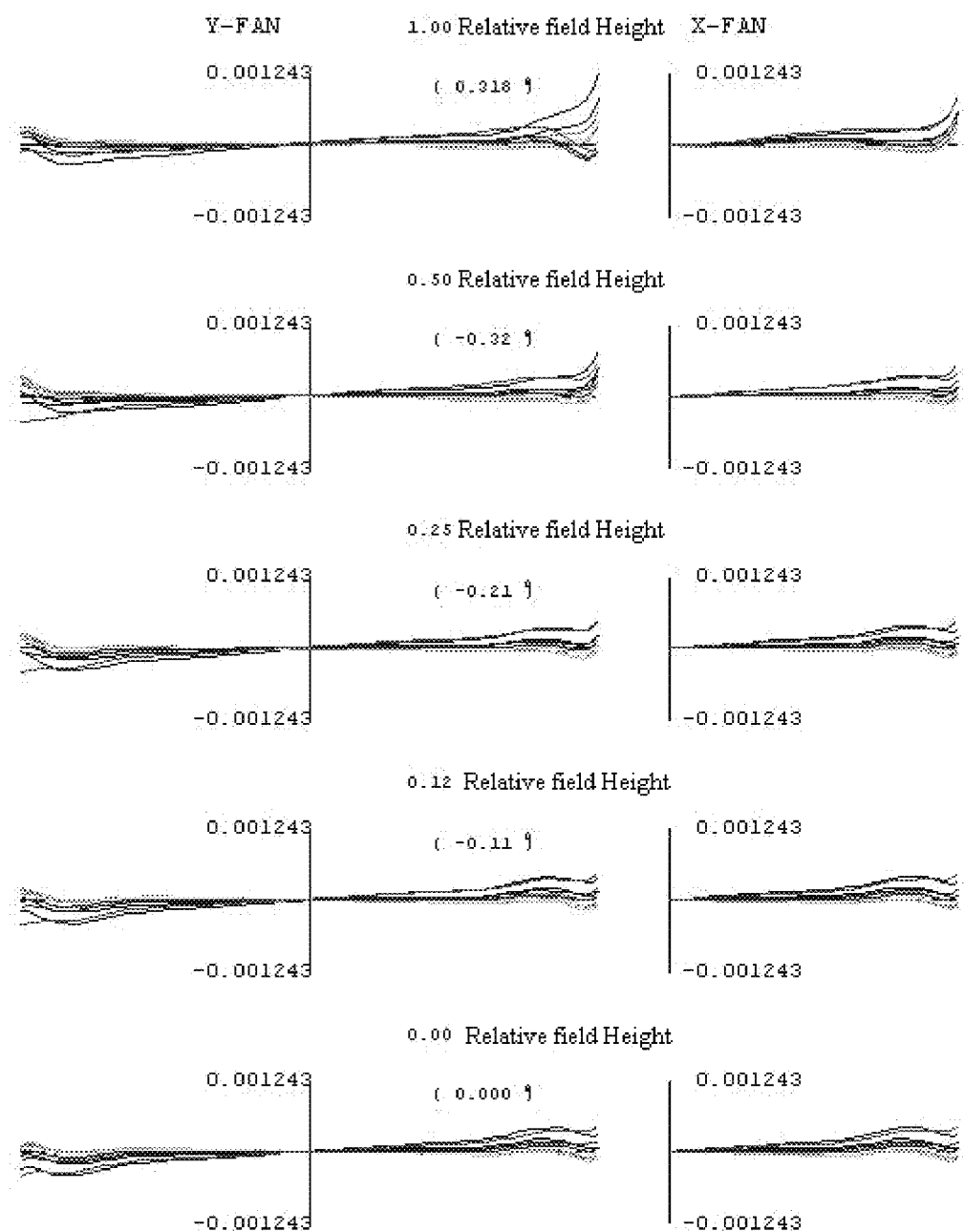
FIG. 7 is a diagram showing a wave-front aberration of a projection objective according to embodiment 2 of present application.

Please refer to FIG. 7, which is a diagram showing a wave-front aberration profile of the projection objective according to embodiment 2 of present application. From the profile, it can be seen that the wavefront of the objective's full field-of-view has been corrected and the chromatic aberration has been well corrected.

Figure 8:
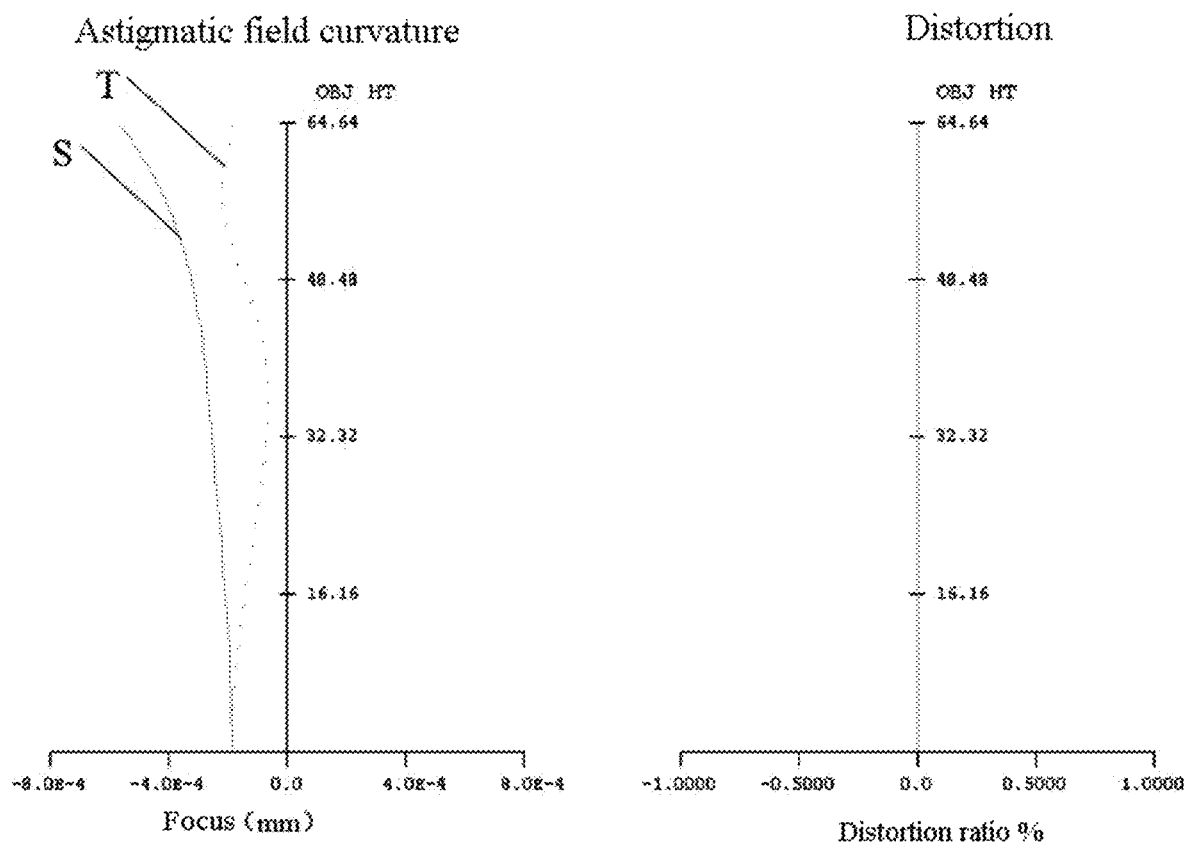
FIG. 8 is a diagram showing a field curvature and a distortion of a projection objective according to embodiment 2 of present application.

Please refer to FIG. 8, which is a diagram showing a field curvature, an astigmatism and a distortion of the projection objective according to embodiment 2 of present application. As can be seen from the figure, each of the meridional field curvature profile T and sagittal field curvature profile S is less than 60 nm, the astigmatism being less than 50 nm, the distortion being about 4 nm.

Figure 9:
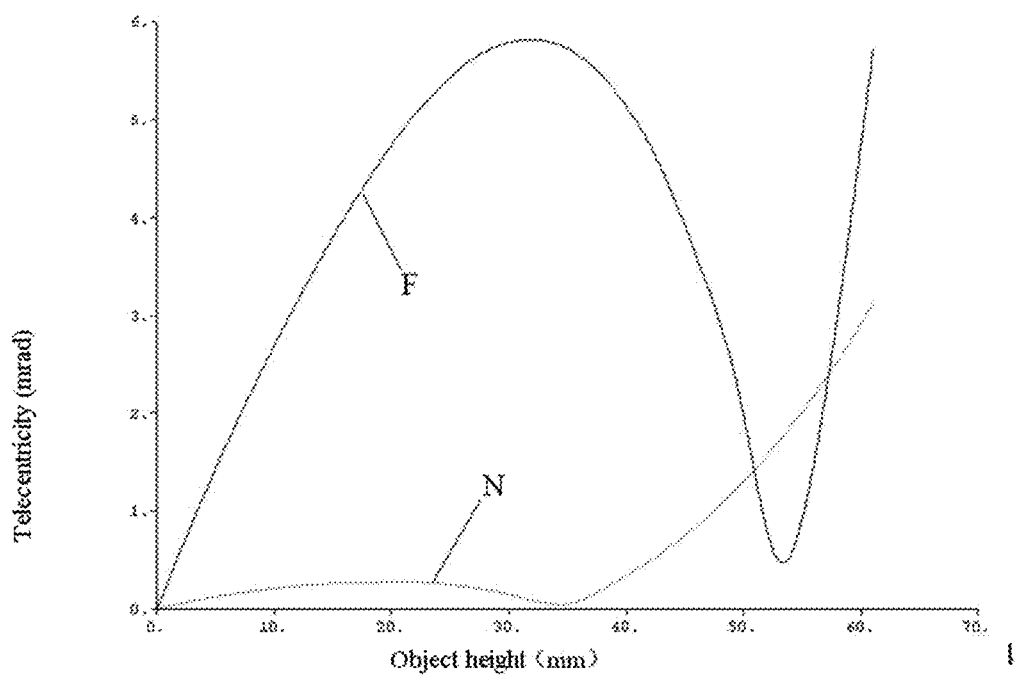
FIG. 9 shows a telecentric profile of a projection objective according to embodiment 2 of present application.

Please refer to FIG. 9, which shows a telecentric profile of the projection objective according to embodiment 2 of present application. As can be seen from the figure, projection objective has a maximum value of telecentricity of less than 6 mrad at the object side, and a maximum value of telecentricity of less than 3 mrad at the image side.

Figure 10:
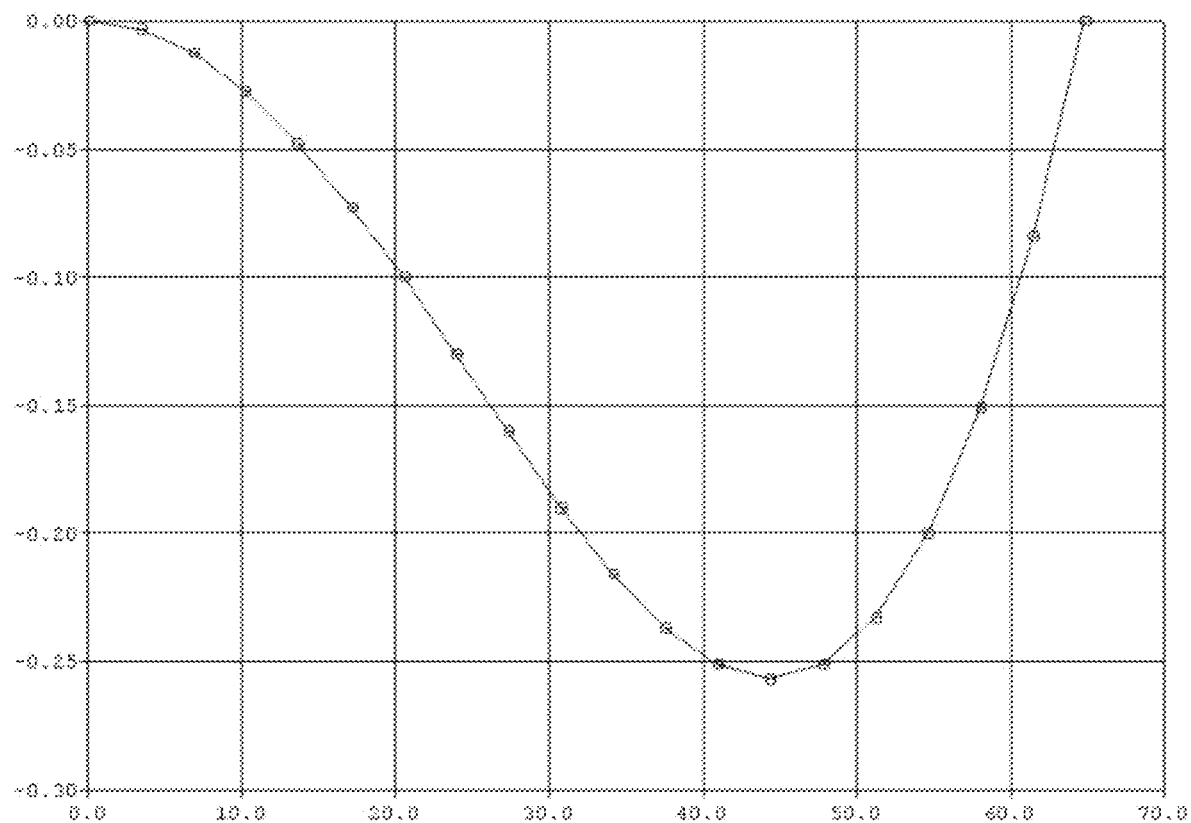
FIG. 10 shows an aspheric profile of a projection objective according to embodiment 2 of present application.

Please refer to FIG. 10, which shows the aspheric profile of the largest aspheric surface in the projection objective according to embodiment 2 of present application. As can be seen from the figure, the aspheric surface has a maximum value of asphericity at a semi-diameter of 45 mm, and the maximum value is 291 μm.

The above-discussed inventive projection objectives are applicable to an exposure apparatus, the exposure apparatus including: a mask stage for supporting a mask; a work stage for supporting a workpiece to be exposed; and a light source for emitting an exposure light beam. The exposure light beam projects a pattern on the mask to the workpiece after passing through the mask stage and the projection objective, and the expression of the aspheric surface in the projection objective is as follows:

$$Z = \frac{(CURV)Y^2}{1+(1-(1+K)(CURV)^2Y^2)^{1/2}} + (A)Y^4 + (B)Y^6 +$$
$$(C)Y^8 + (D)Y^{10} + (E)Y^{12} + (F)Y^{14} + (G)Y^{16} + (H)Y^{18} + (J)Y^{20}$$

where Z is an expression of a curve of the aspheric surface; Y is a semi-diameter dimension; CURV is a curvature; A is a fourth-order constant coefficient; B is a six-order constant coefficient; C is an eighth-order constant coefficient; D is a tenth-order constant coefficient; E is a twelfth-order constant coefficient; F is a fourteenth-order constant coefficient; G is a sixteenth-order constant coefficient; H is an eighteenth-order constant coefficient; J is a twentieth-order constant coefficient; and K is a taper coefficient.

In summary, the projection objective provided in embodiments of the present application is configured to project an image from an object side to an image side. The projection objective sequentially comprises, from the object side along an optical axis: a first lens group with a positive focal power, a second lens group with a negative focal power, a third lens group with a positive focal power, a fourth lens group with a negative focal power and a fifth lens group with a positive focal power. The lens with an aspheric surface is provided in each of the first lens group, second lens group, fourth lens group and fifth lens group to reduce the number of lenses, thereby resulting in a more compact structure and an enhanced transmittance of the projection objective. On the other hand, this also optimizes the structure design of aspheric surfaces, which enables to decrease the asphericity and reduce the difficulty and cost of manufacturing of the aspheric surface. Besides, the projection objective has a bi-telecentric structure, enabling to decrease the sensitivity of the objective to minimal convex or concave defects on a mask surface.

The description above is merely a few preferred embodiments of the present application and not intended to limit the scope of the present application in any sense. Any equivalent alternatives or variations made by those of ordinary skilled in the art based on the disclosed technical solution fall within the protection scope of the appended claims.

What is claimed is:

1. A projection objective for projecting an image from an object side to an image side, the projection objective comprising, sequentially disposed from the object side along an optical axis:
    a first lens group with a positive focal power, comprising
        a first lens sub-group with a negative focal power, wherein one lens of the first lens sub-group has an aspheric surface at a side close to the object side;
    a second lens group with a negative focal power, comprising a first biconcave lens sub-group, wherein a lens of the first biconcave lens sub-group closest to the image side has an aspheric surface at a side close to the object side;
    a third lens group with a positive focal power;
    a fourth lens group with a negative focal power, comprising a second biconcave lens sub-group, wherein a lens of the second biconcave lens sub-group closest to the object side has an aspheric surface at a side close to the image side, wherein the fourth lens group at least comprises three lenses each having a negative focal power; and a fifth lens group with a positive focal power, comprising a third biconcave lens sub-group, wherein a lens of the third biconcave lens sub-group closest to the image side has an aspheric surface at a side close to the image side.

2. The projection objective of claim 1, wherein the first lens group further comprises a second lens sub-group with a positive focal power, and wherein the first lens sub-group at least comprises one lens with a negative focal power and the second lens sub-group at least comprises two lenses each having a positive focal power.

3. The projection objective of claim 1, wherein the second lens group at least comprises four lenses each having a negative focal power, and wherein the first biconcave lens sub-group has a negative focal power and at least comprises two biconcave lenses.

4. The projection objective of claim 3, wherein the second lens group comprises N lenses, N being an even number greater than or equal to 4, and wherein the first biconcave lens sub-group comprises M lenses, M being an even number greater than or equal to 2.

5. The projection objective of claim 4, wherein lenses of the first biconcave lens sub-group are distributed at both sides of a midpoint of an optical path defined by the optical axis passing through the second lens group, wherein lenses of the first biconcave lens sub-group are symmetrically arranged with respect to the midpoint of the optical path.

6. The projection objective of claim 1, wherein the third lens group at least comprises two lenses each having a positive focal power.

7. The projection objective of claim 1, wherein the fourth lens group at least comprises one meniscus lens with a negative focal power.

8. The projection objective of claim 1, wherein the fifth lens group comprises a third lens sub-group, a fourth lens sub-group and a fifth lens sub-group, the third lens sub-group comprising at least two lenses, the fourth lens sub-group at least comprising three lenses, the fifth lens sub-group at least comprising five lenses.

9. The projection objective of claim 8, wherein the fourth lens sub-group comprises the third biconcave lens sub-group, wherein a lens of the third biconcave lens sub-group has an aspheric surface at a side close to the image side, and the third biconcave lens sub-group at least comprises one biconcave lens.

10. The projection objective of claim 8, wherein the fifth lens sub-group at least comprises four meniscus lenses.

11. The projection objective of claim 8, wherein an optical stop of the projection objective is located between the third lens sub-group and the fourth lens sub-group.

12. The projection objective of claim 8, wherein each of the third and fourth lens sub-groups is a lens sub-group having a positive focal power.

13. The projection objective of claim 1, comprising an object side parallel plate and an image side parallel plate, wherein the object side parallel plate is disposed on the optical axis at a side close to the object side, and the image side parallel plate is disposed on the optical axis at a side close to the image side.

14. The projection objective of claim 1, wherein the projection objective has an object side working distance of greater than 32 mm and an image side working distance of greater than 8 mm.

15. The projection objective of claim 1, wherein a maximum asphericity of each of the aspheric surfaces is less than 300 μm.

16. The projection objective of claim 1, wherein the projection objective has an object side telecentricity of less than 6 mrad and an image side telecentricity of less than 3 mrad.

17. The projection objective of claim 1, wherein the projection objective has a field curvature of less than 60 nm, a astigmatism of less than 50 nm and a distortion of less than 4 nm.

18. The projection objective of claim 1, wherein the projection objective has a magnification of −0.25, an image side numerical aperture of 0.65 and an image-side field-of-view size of greater than 26 mm×16 mm.

19. An exposure apparatus using the projection objective according to claim 1, comprising: a mask stage for supporting a mask; a workpiece stage for supporting a workpiece to be exposed; and a light source for emitting an exposure light beam, wherein the exposure light beam projects a pattern on the mask to the workpiece after passing through the mask stage and the projection objective, and wherein an expression of an aspheric surface in the projection objective is as follows:

$$Z = \frac{(CURV)Y^2}{1+(1-(1+K)(CURV)^2Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

where Z is an expression of a curve of the aspheric surface; Y is a semi-diameter dimension; CURV is a curvature; A is a fourth-order constant coefficient; B is a six-order constant coefficient; C is an eighth-order constant coefficient; D is a tenth-order constant coefficient; E is a twelfth-order constant coefficient; F is a fourteenth-order constant coefficient; G is a sixteenth-order constant coefficient; H is an eighteenth-order constant coefficient; J is a twentieth-order constant coefficient; and K is a taper coefficient.

* * * * *